(12) United States Patent
Launay et al.

(10) Patent No.: US 7,532,467 B2
(45) Date of Patent: May 12, 2009

(54) THERMAL MANAGEMENT DEVICES, SYSTEMS, AND METHODS

(75) Inventors: Stephane Launay, Nantes (FR); Andrei G. Federov, Atlanta, GA (US); Yogendra Joshi, Decatur, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 42 days.

(21) Appl. No.: 11/867,070

(22) Filed: Oct. 4, 2007

(65) Prior Publication Data

US 2008/0089029 A1   Apr. 17, 2008

Related U.S. Application Data

(60) Provisional application No. 60/851,020, filed on Oct. 11, 2006.

(51) Int. Cl.
*H05K 7/20* (2006.01)
*H01L 23/427* (2006.01)

(52) U.S. Cl. .................... 361/687; 361/699; 361/695; 361/700; 165/80.3; 165/80.4; 165/121; 165/127; 62/259.2

(58) Field of Classification Search ......... 361/687–697, 361/699–701; 165/80.2, 80.3, 80.4, 80.5, 165/104.21, 104.33, 104.34, 121, 127, 185; 62/3.2, 3.6, 259.2; 257/713–715
See application file for complete search history.

(56) References Cited

U.S. PATENT DOCUMENTS

| 5,757,615 | A  | * | 5/1998  | Donahoe et al. ............ 361/687 |
| 6,674,642 | B1 | * | 1/2004  | Chu et al. .................. 361/687 |
| 6,766,817 | B2 |   | 7/2004  | da Silva |
| 6,833,992 | B2 | * | 12/2004 | Kusaka et al. ............... 361/699 |
| 6,918,404 | B2 |   | 7/2005  | Dias da Silva |
| 7,066,586 | B2 |   | 6/2006  | da Silva |

* cited by examiner

*Primary Examiner*—Michael V Datskovskiy
(74) *Attorney, Agent, or Firm*—Thomas, Kayden, Horstemeyer & Risley, LLP

(57) ABSTRACT

Briefly described, embodiments of this disclosure include thermal management devices, systems, and methods, convection cooling devices, convection cooling systems, convection cooling methods, hybrid convection/desorption cooling devices, hybrid convection/desorption cooling systems, hybrid convection/desorption cooling methods, are disclosed.

24 Claims, 8 Drawing Sheets

THERMAL MANAGEMENT DEVICES, SYSTEMS, AND METHODS

CROSS-REFERENCE TO RELATED APPLICATION

This application claims priority to U.S. provisional application entitled, "Desorption Thermal Management Device," having Ser. No. 60/851,020, filed on Oct. 11, 2006, which is entirely incorporated herein by reference.

BACKGROUND

For many applications, heat is transferred or dissipated to the ambient through conduction and air convection. For a system whose performance is limited by power dissipation it is necessary to increase the heat dissipation capabilities of the system. Because convection heat transfer is commonly the bottleneck of heat transfer, extending the heat transfer area can increase the rate of heat dissipation. An example of this is a radiator. Connecting the radiator to a system heat source can increase the heat transfer area through which heat can be rejected or transferred to the ambient. As the radiator surface area increases, its capability to dissipate heat increases allowing the accommodation of larger system power loads.

The current trend is to design electronic systems to provide more powerful systems in smaller package sizes. In contrast to the previous discussion, this trend signifies increased heat loads and dissipation needs while decreasing the package size and thus the package area available for heat dissipation. Consequently, improving the heat transfer from the heat source of a system to the ambient becomes a significant consideration for this kind of application.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

SUMMARY

Figure 1A:
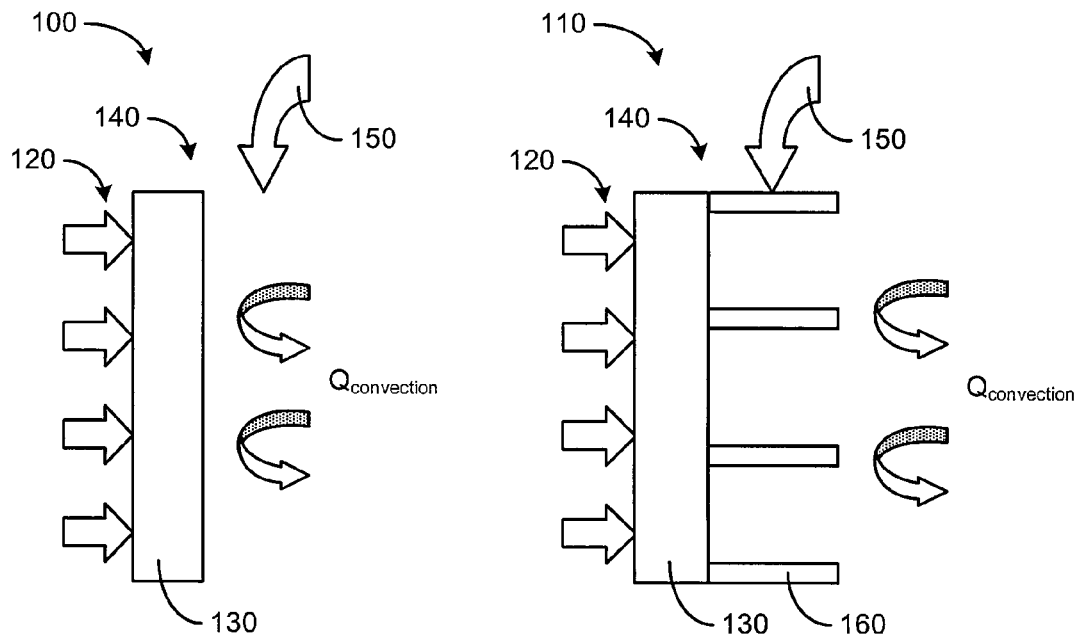
FIG. 1A illustrates embodiments of a convection cooling system without and with cooling fins.

Briefly described, embodiments of this disclosure include thermal management devices, systems, and methods, convection cooling devices, convection cooling systems, convection cooling methods, hybrid convection/desorption cooling devices, hybrid convection/desorption cooling systems, hybrid convection/desorption cooling methods, are disclosed.

One exemplary device, among others, includes: a heat dissipater including a first area and a second area, wherein at least one of the first area and the second area of the heat dissipater is in fluidic communication with a heat source; a first air-flow directed to circulate across the first area of the heat dissipater; and a second air-flow directed to mix with the first air-flow to form a mixed first and second air-flow, wherein the mixed first and second air-flow is further directed to circulate across the second area of the heat dissipater.

One exemplary system, among others, includes: an evaporator for removing heat from a heat source; a heat dissipater including a first area and a second area; a cooling loop for transferring heat from the evaporator to at least one of the first area and the second area of the heat dissipater; a first air-flow directed to circulate across the first area of the heat dissipater; and a second air-flow directed to mix with the first air-flow to form the mixed first and second air flow, wherein the mixed first and second air flow is further directed to circulate across the second area of the heat dissipater.

One exemplary system, among others, includes: means for heat dissipation including a first area and a second area, wherein at least one of the first area and the second area is in fluidic communication with a heat source; means for providing a first air-flow for circulation over the means for heat dissipation; means for providing a second air-flow for mixing with the first air flow and circulation over the means for heat dissipation; means for directing the first and second air-flow, wherein either the first air-flow is directed over the first area of the means for heat dissipation and the mixed first and second air-flow is directed over the second area of the means for heat dissipation or the first air-flow is directed to the second area of the means for heat dissipation and the mixed first and second air-flow is directed to the first area of the means for heat dissipation.

One exemplary method of transferring heat, among others, includes: providing a heat dissipater including a first area and a second area, wherein at least one of the first area and the second area of the heat dissipater is in fluidic communication with a heat source; circulating a first air-flow across the first area of the heat dissipater; circulating a second air-flow to mix with the first air-flow to form a mixed first and second air-flow; and circulating the mixed first and second air-flow across the second area of the heat dissipater.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of physics, thermodynamics, heat transfer, chemistry, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Discussion

Embodiments of the present disclosure include thermal management devices, systems, and methods. In particular, embodiments of the present disclosure include convection cooling devices, convection cooling systems, convection cooling methods, hybrid convection/desorption cooling devices, hybrid convection/desorption cooling systems, hybrid convection/desorption cooling methods, and the like. Embodiments of the present disclosure can be used in computers, cell phones, PDSs, televisions, global positioning systems, audio and/or video players, fuel cells, solar cells, photovoltaic devices, air conditioning systems, and the like, to remove heat. In particular, embodiments of the present disclosure can be used to remove heat generated by computer chips, display screens, or other electronics. Embodiments of the present disclosure allow for the separation of the location of a heat source, where the energy is supplied and needs to be dissipated, and the location where heat is rejected (transferred) to the environment.

In an embodiment, a device includes a heat dissipater including a first area and a second area. At least one of the first area and the second area of the heat dissipater is in fluidic communication (e.g., direct or indirect contact of a fluid (e.g., air, one or more gases, coolant liquid (e.g., water)), and the like) with a heat source. In an embodiment, a first air-flow is directed to circulate across the first area of the heat dissipater, while a second air-flow is directed to mix with the first air-flow to form a mixed first and second air-flow. The mixed first and second air-flow is directed to circulate across the second area of the heat dissipater. It should be noted that the air flows (or fluid flows) can be reversed and/or alternated, as described in the Example.

In particular, mixing a hot air flow (first-air flow) saturated with a water vapor desorbed from the first area and a cold air flow (second-air flow) produces a mist air. The mist air (air with suspension of fine water droplets) interacts with a second area, leading to adsorption of the water vapor on the surface of the second area, which is favorable for sorbent bed regeneration. Since adsorption/desorption is a transient process, using multiple (two or more) heat dissipaters allows for the "passive" sorbent bed(s) to be regenerated by adsorption of the water vapor from the water-saturated air stream, while simultaneously removing heat by desorption of water vapor at the other "active" sorbent beds.

In another embodiment, a system includes an evaporator for removing heat from a heat source and a heat dissipater including a first area and a second area. A cooling loop for transferring heat from the evaporator to at least one of the first area and the second area of the heat dissipater (condenser) is also provided. A first air-flow is directed to circulate across the first area of the heat dissipater, while a second air-flow is directed to mix with the first air-flow to form the mixed first and second air flow. The mixed first and second air flow is directed to circulate across the second area of the heat dissipater. It should be noted that the air flows (or fluid flows) can be reversed and/or alternated, as described in the Example.

The use of a cooling loop allows one to separate in space the location of the heat source, where the energy is supplied and needs to be dissipated, and the place (the heat dissipater) where heat is rejected (transferred) to the environment. One advantage of a two-phase cooling loop is to transfer heat from a heat source localized in a confined space (e.g., computer chip) to a much greater in size and more accessible space away from the source for ultimate heat rejection to environment, while maintaining the overall heat transfer coefficient (between the source and environment) large.

FIG. 1A illustrates embodiments of a convection cooling system without and with cooling fins 100 and 110, respectively. In the convection cooling system without cooling fins 100, a heat load 120 is applied to a plate 130 acting as a radiator 140. The heat load can be from a heat source such as, but not limited to, a computer chip, a display screen, or electronics. The plate 130 can be made from materials such as, but not limited to, metals, polymers, ceramics, composite materials and/or combinations thereof. The temperature of the radiator 140 increases as energy from the heat load 120 is applied. The heat load is then transferred by convection to the air-flow 150 moving past the radiator 140 (e.g., plate 130). In the cooling system with cooling fins 110, adding cooling fins 160 to the plate 130 increases the heat transfer area of the radiator 140. The cooling fins 160 can be made from materials such as, but not limited to, metals, polymers, ceramics, composite materials and/or combinations thereof. In addition to the plate temperature, the fin temperature increases as the heat load 120 is applied to the radiator 140 (e.g., plate 130 and cooling fins 160). Increasing the size and/or the surface area of the radiator 140 allows more heat to be transferred to the ambient by convection.

Figure 1B:
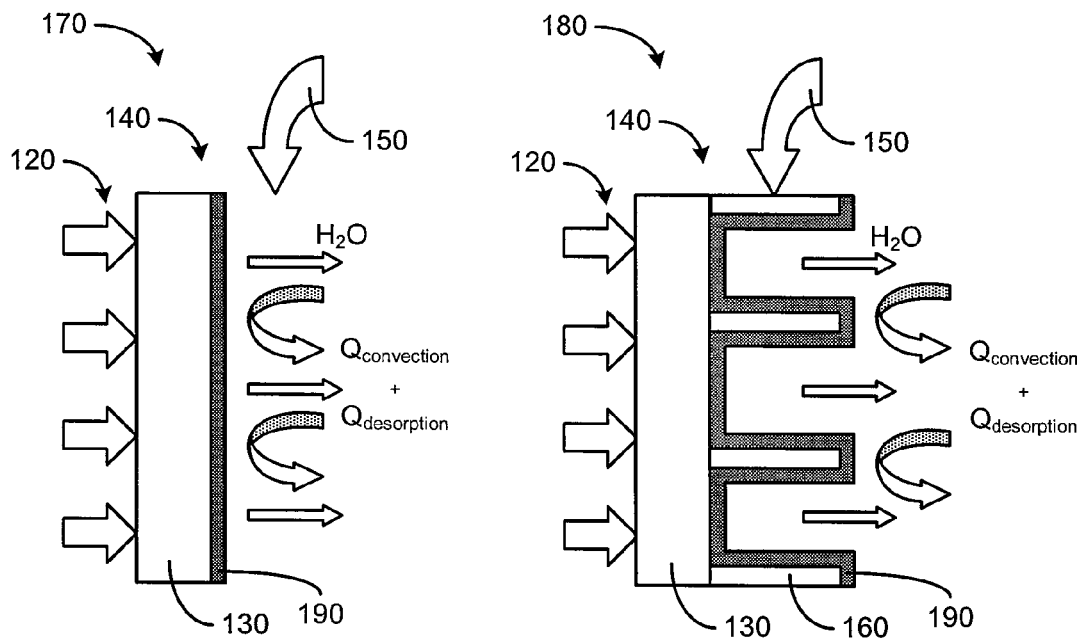
FIG. 1B illustrates embodiments of a hybrid convection/desorption cooling system without and with cooling fins.

FIG. 1B illustrates embodiments of a hybrid convection/desorption cooling system without and with cooling fins 170 and 180, respectively. The difference between the convection systems 100 and 110 and hybrid systems 170 and 180 is the adsorbent material layer 190, which covers the cooling fins 160 and/or plate 130 of the radiator 140. Whereas the heat is only transferred to the ambient by convection in the convection cooling systems 100 and 110, heat dissipation is increased by the combination of convection and desorption heat transfer in the hybrid systems 170 and 180. In a heated surface covered by an adsorbent material 190, the heat transfer by convection and desorption are combined, which increases the total rate of heat removal.

The use of desorption allows more heat to be dissipated from a system without an increase of the cooling system volume. Desorption is the inverse phenomena of adsorption. In adsorption, a vapor molecule that gets close to a solid surface can be attracted to the surface. A chemical bond (chemisorption) or weak physical van der Walls force coupling (physisorption) between the molecule and the surface may then be formed which produces heat. In desorption, energy input is necessary to break the chemical bond (chemisorption) or weak physical van der Walls force coupling (physisorption) between the molecule and the solid surface. The energy needed to break the chemical and/or physical coupling will come from a heat source. The amount of energy required is dependent upon the structure and physico-chemical nature of the interacting solid and gas molecule. In the case of water vapor adsorption, the enthalpy of adsorption is in the same order as water vaporisation enthalpy (e.g., about 2400 kJ/kg for saturated water). From an energetic point of view, desorption is equivalent to vaporisation, which represents a good reference for determining the thermal heat transfer efficiency.

In one embodiment, among others, the water vapor from the air can be adsorbed and desorbed by the adsorbent material 190. This embodiment is autonomous in that a water delivery system is not utilized. Other embodiments can incorporate water delivery (e.g. misting) systems and/or dehumidifiers to control the relative humidity of the air-flow 150. The desorbed water vapor is transferred outside the system by the air-flow 150, which has been heated by convection as it comes in contact with the radiator 140. Consequently, more heat is transferred to the ambient and the temperature of the heat source increases more slowly than if a gas phase convection cooling system were used alone. The system is automatically regenerated (e.g., by water-vapor adsorption on the adsorbent) as soon as the heat load is stopped or reduced.

Performance of desorption cooling systems is strongly dependant upon the characteristics of the adsorbent material layer 190. The adsorbent material 190 can include inorganic and/or organic materials including, but not limited to, air dryers, activated carbon, silica gel, alumina, calcium chloride, zeolite, polymers, and combinations thereof. The absorbent material 190 can be porous to provide a large active surface area for adsorption and desorption. Pore sizes are about 0.1 nm to 100 µm, about 0.5 nm to 10 µm, about 1.0 nm to 1 µm, about 5.0 nm to 100 nm, and about 10 nm to 50 nm. The ability to adsorb a quantity of water-vapor from air of a specific relative humidity also depends upon the porous materials structure and chemical composition. Some materials are capable of adsorbing water-vapor from air with a relative humidity lower than 20%.

Characteristics of the adsorbent material 190 to be considered can include, but are not limited to, the equilibrium mass adsorbed as function of temperature and pressure, the adsorption/desorption kinetic rate of the material, the enthalpy of adsorpotion of the material, and/or the regeneration capability of the material. In regard to relevant temperatures for water adsorption/desorption, the temperature is about 20° C. to 300° C., about 40° C. to 200° C., about 40° C. to 150° C., about 50° C. to 100° C., about 60° C. to 90° C., and about 70° C. to 80° C. depending on the type of adsorbent material, the relative humidity of the ambient air, and, or ambient temperature and pressure. In addition, the choice of the adsorbent material can depend upon the system operating temperature.

In regard to equilibrium mass, this mass represents the amount of adsorbed water mass per adsorbent material unit mass. Desorption occurs when the adsorbent material 190 contains some quantity of adsorbed water, which is greater than an equilibrium mass at a given pressure, temperature, and relative humidity of the ambient air. Some materials can adsorb large quantities of water, e.g. as much water as their own mass. The equilibrium mass can range from about 0.4 to 1.2 kg $H_2O$ per 1 kg of dry adsorbent and even greater ranges are possible.

In regard to desorption kinetics rate, this rate is relative to the porous medium apparent surface area and the relative humidity of the ambient air and includes the effect of an intrinsic rate of adsorbate-adsorbent coupling and mass transfer rate to deliver the gas molecule from the bulk to the adsorbent surface. A larger rate indicates better dissipation of heat flux due to the desorbed gas kinetics, and is achieved by minimizing the mass transfer resistance of the adsorbent. The desorption kinetics rate can range from about $10^{-3}$ $s^{-1}$ to $10^9$ $s^{-1}$, about 1 $s^{-1}$ to $10^6$ $s^{-1}$, about 10 $s^{-1}$ to $10^5$ $s^{-1}$, and about $10^2$ $s^{-1}$ to $10^4$ $s^{-1}$.

In regard to desorption enthalpy, the water-vapor desorption enthalpy can range from about 0 kJ/kg to 3500 kJ/kg, about 500 kJ/kg to 3000 kJ/kg, about 1000 kJ/kg to 2500 kJ/kg, and about 1500 kJ/kg to 2000 kJ/kg, depending of the adsorbent material type. The enthalpy can be higher than the water vaporisation enthalpy of about 2400 kJ/kg for saturated water.

In regard to regeneration capability, it is defined as the period over which the adsorbent material can be regenerated without any detrimental effects (e.g., aging) on its adsorption/desorption abilities.

The relative humidity of the air plays a role in cooling system performance. Air at low relative humidity can favor desorption of water vapor from the material in contact with air, while air with higher relative humidity can favor adsorption on water vapor on the material in contact with air. In addition, the air-flow 150 can influence the cooling system performance. For example, for the same amount of water vapor in the air, the relative humidity of the air decreases as the air is heated affecting both adsorption and desorption. In the case where the air-flow 150 is heated by convection upon contact with the adsorbent material 190, the characteristics of the adsorbent material 190 can influence the heat transfer. Influencing characteristics can include, but are not limited to, thermal conductivity and heat capacity of the material 190 and contact area between material 190 and the radiator 140 (i.e., the fins 160 and/or the plate 130). As the air-flow 150 is heated, the water vapor absorption capacity of the air-flow 150 increases and the cooling system air-flow rate needed to remove the same amount of heat could be reduced. This would result in reduction of the pressure drop and pumping power required for operation of the thermal management system.

The desorption phenomenon exploits the properties of adsorbents, which adsorb and desorb water vapor from the air, and when combined with the air capability to transport a large amount of water vapor when heated, it can be used as a basis of the highly efficient and compact heat dissipation (thermal management) system. Desorption based thermal management, being a transient phenomenon requiring regeneration, is useful in cooling applications in which power dissipation needs can be high during a defined time period. Laptop cooling represents a typical case where the small available volume requires a very compact cooling solution with high density of heat removal during active power periods (e.g., when running high performance software applications).

A hybrid convection/desorption cooling system, used as a thermal solution for managing transient spikes in heat load, can be compared to phase change materials (PCM). Phase change materials are able to absorb heat when the material changes phase (e.g., from solid form to liquid form) at a specific temperature. When a transient spike in the heat load occurs and the PCM reaches this specific temperature, a large amount of heat can be absorbed by the PCM during the phase change process. When the spike in heat load terminates, the heat is slowly rejected to the ambient inducing PCM regeneration and reversion back to its original form (e.g., change from liquid to solid).

Desorption presents several advantages when compared to the PCM. First, desorption is an open system where the heat load is transferred directly to the atmosphere (e.g., the heat load induces desorption of water vapor from the material, which is carried away by the air upon interaction with the material, and is directly discharged to the atmosphere) by exploiting the capacity of hot air to carry significant amounts of moisture without condensation. Thus, no liquid phase is present in the system other than water in its adsorbed or entropically confined state. In contrast, PCM is a closed system where the heat load dissipated by the heat source is stored in the PCM. Second, the adsorbent material has a much lower thermal inertia that can accommodate rapid changes in the heat load in comparison to PCM. Third, the adsorbent material has a larger active surface area for desorption to take place. This added area allows for dissipation of a larger heat flux over a short time period than that possible with PCM, which is usually a bulk solid material. Fourth, the water vapor desorption enthalpy can be up to ten times higher than the solid/liquid phase change enthalpy of the PCM. Therefore, given an identical material weight of adsorbent material and PCM, the heat dissipated by desorption is approximately ten times greater than the heat stored in the PCM. However, environmental and/or ambient conditions can have a larger effect on desorption cooling system performance when compared to the PCM.

Now having described embodiments of the present disclosure in general, the following examples describe some embodiments of the present disclosure and uses thereof. The following is a non-limiting illustrative example of an embodiment of the present disclosure that is not intended to limit the scope of any embodiment of the present disclosure, but rather is intended to provide some experimental conditions and results. Therefore, one skilled in the art would understand that many experimental conditions can be modified, but it is intended that these modifications be within the scope of the embodiments of the present disclosure.

EXAMPLE

Many applications are concerned with heat dissipation through ambient air. To perform experimental testing, one embodiment, among others, has been designed and realized for laptop microchip cooling. After a description of the application, the experimental set up and procedures will be discussed.

In a computer, the main heat source can be the microchip. The heat generated during the operation of the microchip is dissipated to maintain the operating temperature at or below a design operating temperature limit. The design operating temperature limit is determined by the material composition, reliability, and performance concerns of the electronics component and can range from about 0° C. to 250° C., about 20° C. to 150° C., about 40° C. to 120° C., and about 60° C. to 85° C. The heat dissipated by the electronic component (e.g., microchip) usually increases with increased performance, i.e. the higher the performance level, the more power used during chip operation, and the greater the heat production. In order to maintain the microchip temperature below a design operating temperature limit, several cooling systems may be used.

Figure 2:
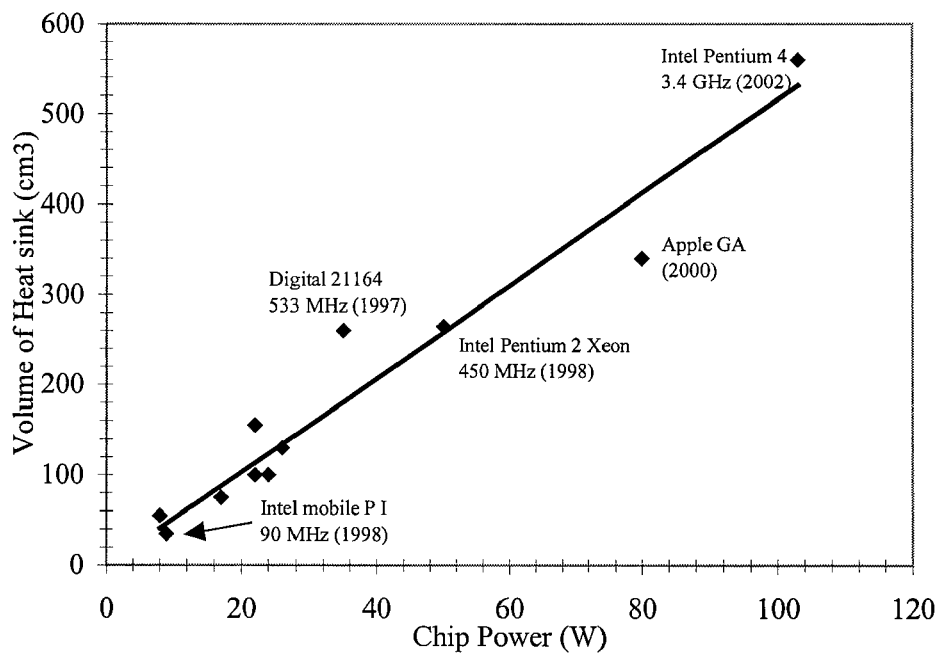
FIG. 2 is a plot that illustrates the heat sink volume utilised to dissipate various microchip power levels.

FIG. 2 is a plot that illustrates the heat sink volume utilized to dissipate various microchip power levels. As chip power increases, the cooling system volume (radiator and fans) increases as well. For desktop computers, the heat load can exceed 100 Watts and the associated radiator volumes can exceed 500 cm$^3$. For laptop computers, the heat load may be limited to 40 Watts because of the difficulty extracting larger quantities of heat without also enlarging the cooling system.

The performance difference between laptop and desktop computers is usually noticeable when performing calculations or 3D game applications. For applications such as spreadsheet and word processing (e.g., Microsoft Office and Excel), drawing, Internet browsers or DVD readers, the microchip mean power utilised is usually lower than 40 Watts. However, during file recording, saving or reading, the desktop microchip power can achieve levels of about 100 Watts for maximum efficiency. In order to obtain such performance in laptop computers, it may be necessary to improve the cooling system thermal transfer capabilities without increasing the system size.

Experimental Set Up

One embodiment of a hybrid convection/desorption cooling system, among others, has been designed for laptop cooling. Other embodiments can be developed for desktop or other microprocessor applications. Derived from principles of the desorption phenomena, the embodiment design is based on several points. First, water vapor should not be in contact with the electronic components to avoid electrical interference and the possibility of shorting the electric circuit. Second, surface area of the adsorbent material should be as large as possible and its pore structure should be made easily accessible for water vapor diffusion to the adsorbent surface in order to take advantage of desorption, which is a surface phenomenon. Third, desorbed water vapor can be transported using a small flow rate of pre-heated air.

Figure 3:
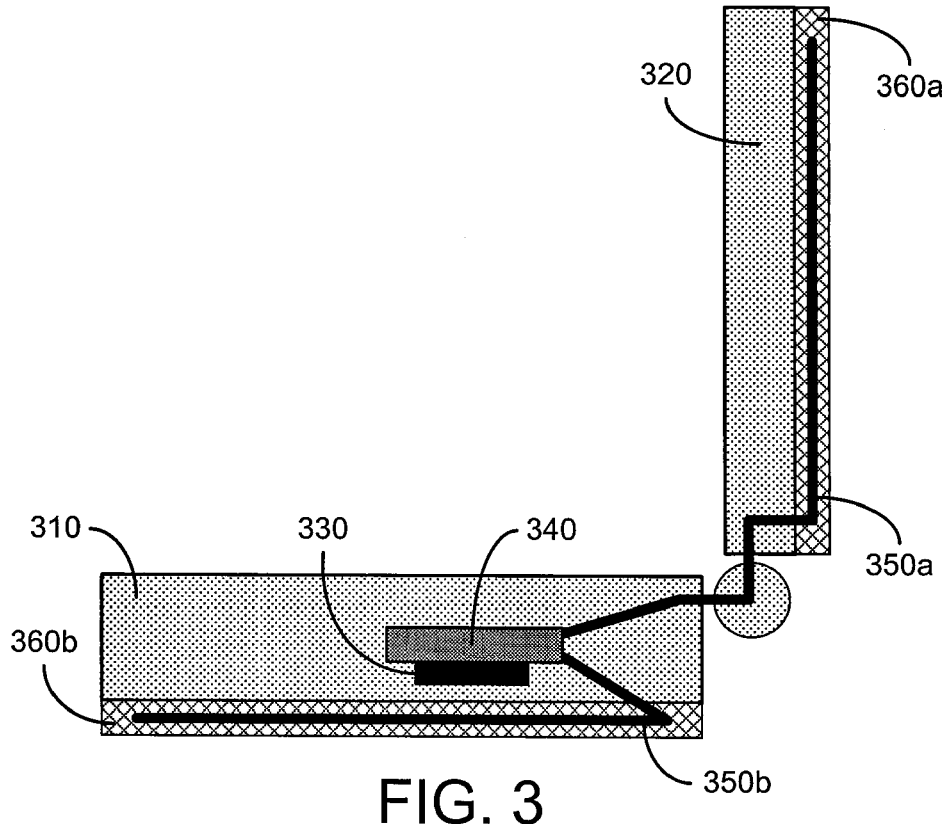
FIG. 3 is an illustration of an exemplary hybrid convection/desorption cooling system for a laptop computer.

FIG. 3 illustrates an exemplary hybrid convection/desorption cooling system for a laptop computer. The laptop computer is comprised of a processor case 310, which houses a system microchip 330, and a screen assembly 320. An evaporator 340 is disposed on the microchip 330 to remove heat generated by the microchip 330 during operation. Cooling loops 350a and/or 350b containing coolant material can be used to transfer the heat collected by the evaporator 340 to heat dissipaters 360a and 360b where the heat is diffused to the atmosphere. Cooling loops 350a and/or 350b can include a two-phase closed loop such as, but not limited to, a thermosiphon or a capillary pump. Heat dissipaters 360a and 360b can be disposed on the bottom of the processor case 310 and/or the back of the screen assembly 320, respectively. Alternatively, heat dissipaters can be provided as free-standing units.

The heat dissipaters 360a and 360b can be comprised of a radiator, which includes fins and air channels, and/or adsorbent material. The shape of the cooling system can vary based upon application, design and manufacturing conditions. Radiators can be made from materials such as, but not limited to, metals, alloys, polymers, ceramics, composites, and combinations thereof. Using materials with a higher thermal conductivity allows for exploitation of their enhanced heat dissipation properties. One embodiment of a heat dissipater, among others, is a radiator that can be manufactured from a flat aluminium plate. Manufacturing can include, but is not limited to, machining, casting, stamping, molding, and/or combinations thereof. The plate dimensions can vary in size based upon, but not limited to, the laptop screen or bottom of the case. For example, in one embodiment, the plate can be about 300 mm wide, about 200 mm long, and about 5 mm thick. Adsorbent material can include, but is not limited to, air dryers, activated carbon, silica gel, porous alumina, calcium chloride, zeolite, polymers, and combinations thereof. The absorbent material can be porous to provide a large active surface area accessible for adsorbate (e.g., water vapor) for adsorption and desorption. Depending on the application, other chemicals may be utilized as adsorbate. Some of these adsorbate chemicals may require adding an extra sub-system where the adsorbate is separated from the air prior to being exhausted into the atmosphere or the sub-system operation is a closed loop.

Figure 4A:
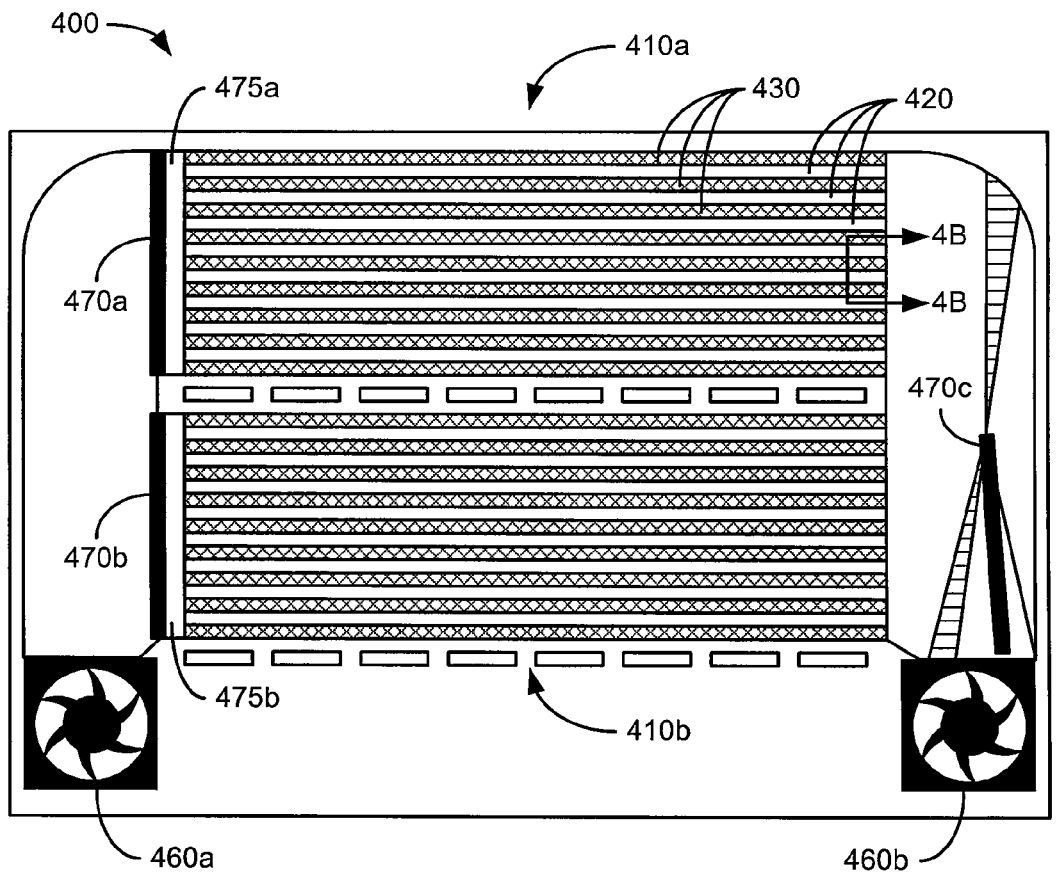
FIG. 4A is an illustration of an exemplary thermal management device used in a hybrid convection/desorption cooling system for a laptop computer.
Figure 4B:
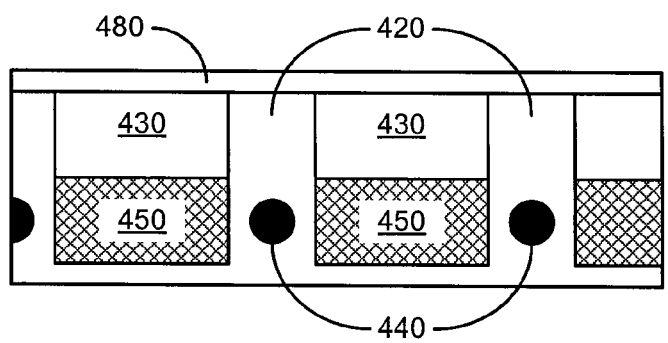
FIG. 4B is an illustration of a cross-section of a heat dissipater of the thermal management device of FIG. 4A.

FIG. 4A is an illustration of an exemplary thermal management device 400 used in a hybrid convection/desorption cooling system for a laptop computer. FIG. 4B is an illustration of a cross-section (4B-4B) of a heat dissipater of the thermal management device 400 of FIG. 4A. In the embodiment of FIG. 4A, an aluminium plate has been manufactured to provide a heat dissipater with two fin areas 410a and 410b. The fin areas 410a and 410b are comprised of fins 420 and channels 430, as illustrated by cross-section 4B-4B in FIG. 4B, to allow heat to be exchanged between the heat dissipater and air flowing through the channels 430. Heat is transferred from the laptop microchip to the fin areas 410a and 410b by the coolant material flowing through condenser pipes 440 located in the heat dissipater that are connected to cooling loops 350a and/or 350b (see FIG. 3). Adsorbent material 450 is disposed in the channels 430 to improve the rate of heat removal. In general, the channels 430 can be suitably filled with adsorbent material 450 to exploit the thermal dissipation capabilities while maintaining a manageable (e.g., as small as possible) pressure drop of the flowing air.

The air-flow can be generated from two flat blowers 460a and 460b. The air-flow circulates through the channels 430 of the parallel fin areas 410a and 410b. Three valves 470a, 470b, and 470c allow for modification of the air-flow circulation through fin areas 410a and 410b and/or exhaust ports 475a and 475b. The channels 430 of the parallel fin areas 410a and 410b are covered by a thin plate 480 as illustrated in FIG. 4B. In the current embodiment, a thin aluminium plate about 0.5 mm thick may be used.

Figure 5:
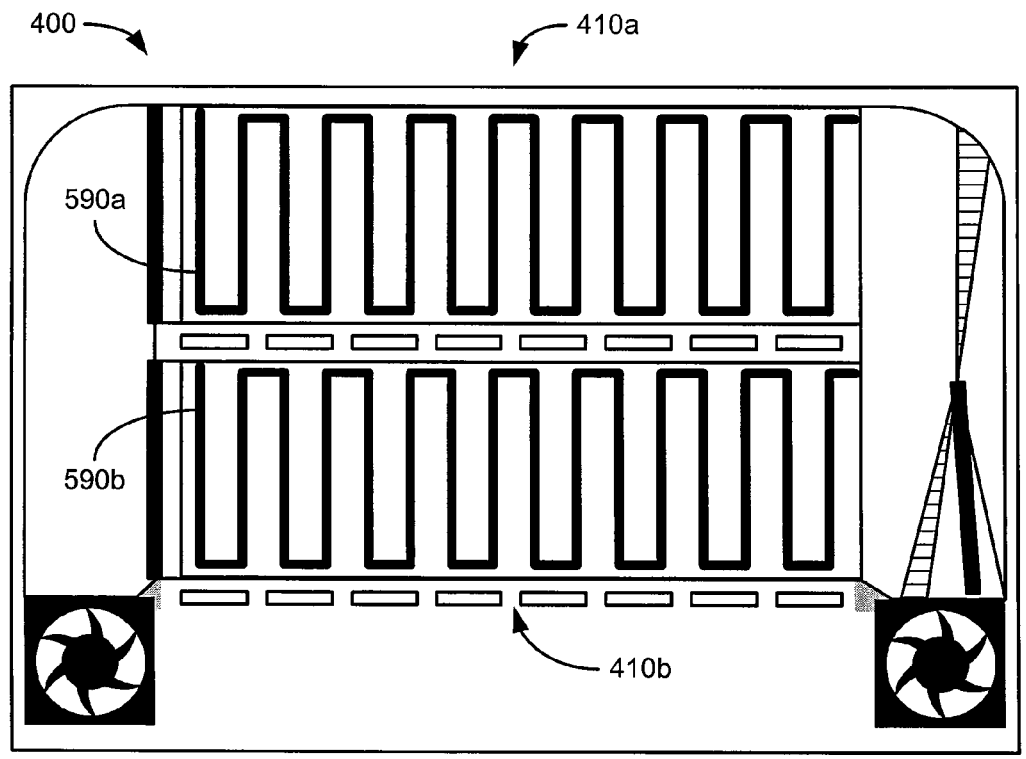
FIG. 5 is an illustration of the exemplary thermal management device of FIG. 4A used with a controllable heat load.

FIG. 5 is an illustration of the exemplary thermal management device 400 of FIG. 4A used with a controllable heat load. To study the role of the desorption phenomena on heat transfer, the heat load is controlled using two flat thin film (e.g., Kapton™-based) heaters 590a and 590b instead of condenser pipes 440. The heaters 590a and 590b are disposed on the aluminum plate adjacent to the two fin areas 410a and 410b.

Currently available laptops are designed to operate with the microchip temperatures below about 85° C. This temperature represents one criteria considered in choosing of the adsorbent material 450. That is desorption should be sufficiently fast at temperatures below about 85° C. Adsorbent materials that can be used for the water vapor adsorption include, but are not limited to, silica gel, alumina, activated carbon, and composite adsorbent $SiO_2 xCaCl_2$.

Silica gel and composite adsorbent $SiO_2$—$CaCl_2$ can be used as adsorbent material for desorption at a low temperature. Silica gel is an inert material that is non-flammable and can be regenerated. The internal structure of the silica gel is composed of interconnected microscopic pores, which can hold water vapor by adsorption and capillary action after Kelvin condensation. Similarly, composite adsorbent $SiO_2$—$CaCl_2$ can desorb water vapor at sufficiently low temperature with a high desorption enthalpy and has a large capacity for water stocking. In an embodiment, among others, silica gel grade 03, activated carbon CS400 and/or combinations thereof can be used as adsorbent material.

Figure 6:
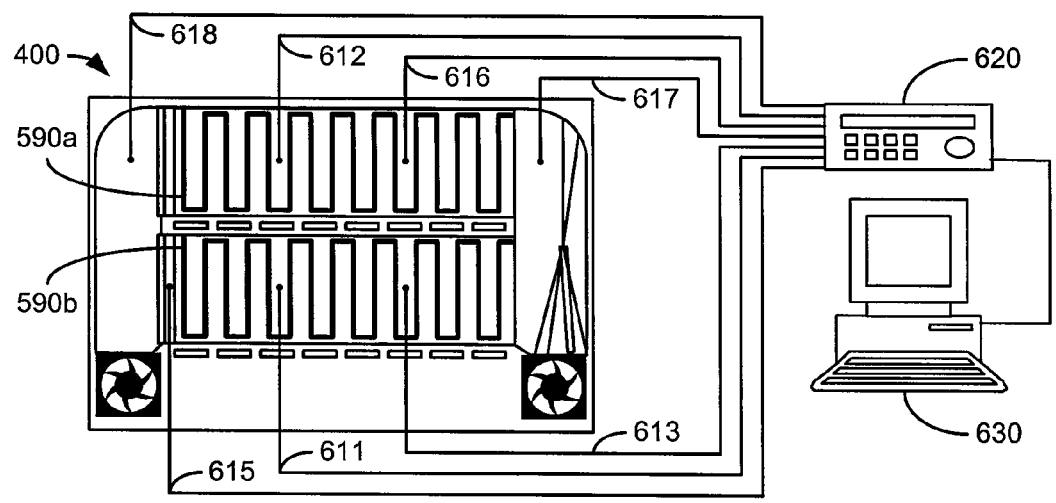
FIG. 6 is an illustration of an experimental set up of the thermal management device of FIG. 5.

FIG. 6 is an illustration of an experimental set up of the thermal management device 400 of FIG. 5. The thermal management device 400 and the two thin film heaters 590a and 590b are embedded between two polycarbonate flat plates, approximately 10 mm thick, in order to reduce the heat losses. Power is supplied to the heaters 590a and 590b by a variable AC power supply. Seven copper-constantan thermocouples are positioned at different locations in the thermal management device 400 as indicated in FIG. 6. Thermocouples 612 and 616 measure the heat dissipater interface temperatures when the heater 590a is used. Thermocouples 611 and 613 measure the heat dissipater interface temperatures when the heater 590b is used. Thermocouples 615, 617 and 618 measure the air temperature at different locations along the air-flow paths. Thermocouple 615 measures the air temperature at exhaust port 475b. Thermocouples 618 and 617 measure the air temperature at the inlet and outlet of fin area 410a, respectively. The acquisition of temperature measurements and heat load data is executed every 3 seconds by a Fluke data acquisition unit 620. The data is transferred to a computer 630 for storage and post-processing.

Experimental Methods

The heat removal capabilities of the exemplary thermal management device 400 are examined by turning on and off the thin film heaters 590a and 590b. The heat load imposed by heaters 590a and 590b can be varied between 40 and 100 Watts. The air-flow circulation and distribution can be controlled by varying the positions of valves 470a, 470b, and 470c.

Figure 7:
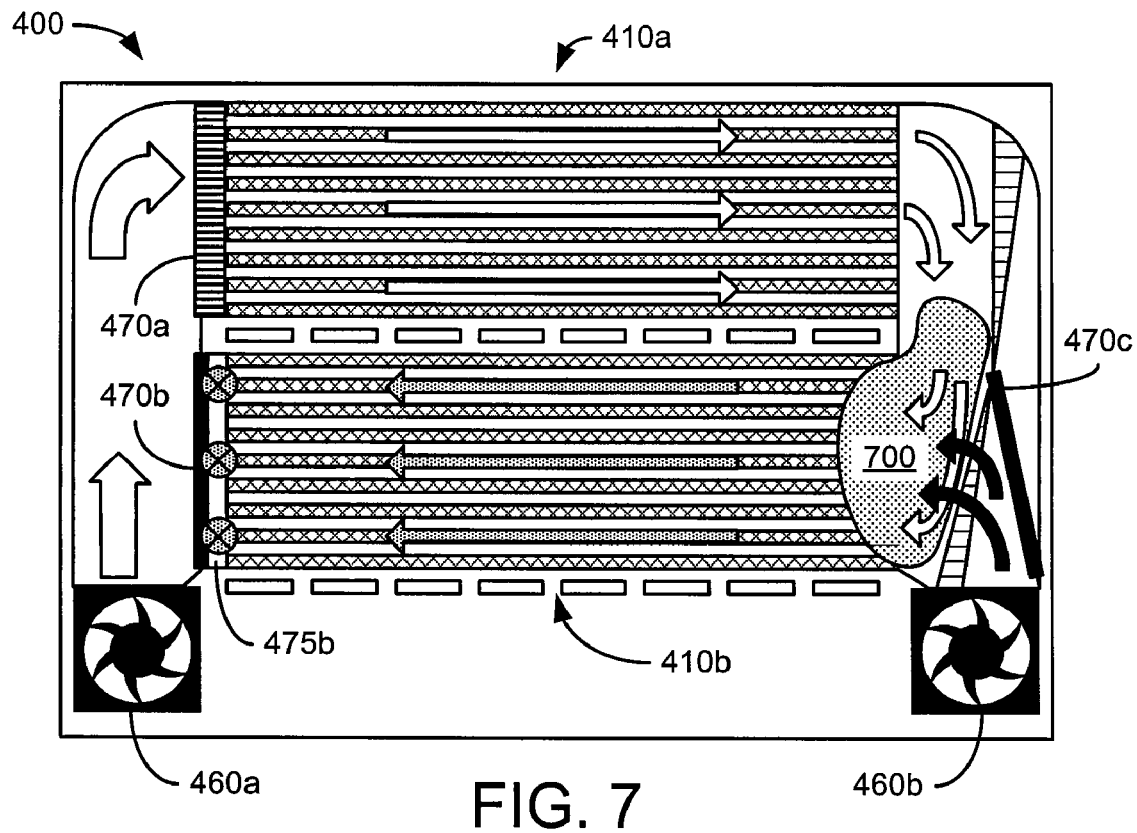
FIG. 7 is an illustration of air-flow circulation for cooling the first fin area of the thermal management device of FIG. 5.

FIG. 7 is an illustration of air-flow circulation for cooling the first fin area 410a of the thermal management device 400 of FIG. 5. Before applying a heat load by turning on heater 590a, the path of the air-flow is set by positioning the three valves 470a, 470b, and 470c as follows:

valve 470a is positioned to allow the air-flow from the fan 460a into fin area 410a;

valve 470b is positioned to prevent the air-flow from fan 460a directly into the fin area 410b while allowing the air flow from the fans 460a and 460b to the exhaust through the exit port 475b; and valve 470c is positioned to direct the air-flow from fan 460b through the fin area 410b.

Once the valves 470a, 470b, and 470c are positioned, the two fans 460a and 460b are turned on and the heater 590a applies a heat load. With the heater 590a turned on, the plate, fins 420 and/or adsorptive material 450 (if present) of fin area 410a are heated. The air being supplied by fan 460a is directed into fin area 410a and heated by convection heat transfer as it comes in contact with the fins 420 and/or adsorptive material 450. The increase in the air temperature results in a decrease in the relative humidity of the air, which amplifies desorption phenomena and transfers additional heat to the air-flow via mass transfer. At the outlet of fin area 410a, the air is hot and humid since it carries water vapor that was desorbed by the adsorptive material 450 present in fin area 410a. At the inlet to fin area 410b, the hot and humid air exiting fin area 410a is mixed with cooler air being supplied by fan 460b. The mixing causes a mist area 700 to be produced at the inlet to fin area 410b by the formation of water droplets suspended in the air. The water droplets can be adsorbed by the adsorptive material 450 present in fin area 410b, thus regenerating the adsorptive material 450. The air-flow is discharged from fin area 410b through exhaust port 475b.

Figure 8:
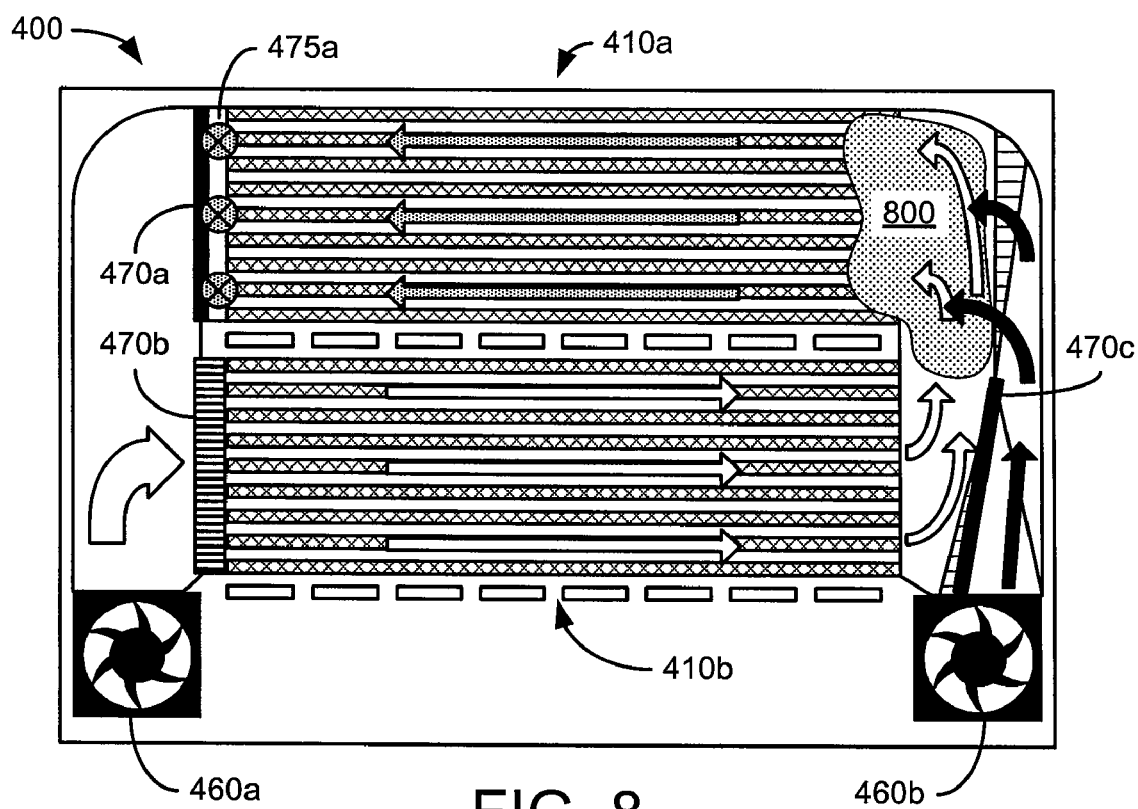
FIG. 8 is an illustration of air-flow circulation for cooling the second fin area of the thermal management device of FIG. 5.

FIG. 8 is an illustration of air-flow circulation for cooling the second fin area 410b of the thermal management device 400 of FIG. 5. Before applying a heat load from the heater 590b, the path of the air-flow is set by positioning the three valves 470a, 470b, and 470c as follows:

valve 470a is positioned to prevent the air-flow from fan 460a directly into the fin area 410a while allowing the air-flow from the fans 460a and 460b to exhaust through the exit port 475a;

valve 470b is positioned to allow the air-flow from the fan 460a into fin area 410b; and valve 470c is positioned to direct the air-flow from fan 460b through the fin area 410a.

With valves 470a, 470b, and 470c in these new positions, the system operates following the same principles as the described for FIG. 7. The air being supplied by fan 460a is directed into fin area 410b and heated by convection heat transfer as it comes in contact with the fins 420 and/or adsorptive material 450. The increase in the air temperature results in a decrease in the relative humidity of the air, which amplifies desorption phenomena and transfers additional heat to the air-flow via mass transfer. At the outlet of fin area 410b, the air is hot and humid since it carries water vapor that was desorbed by the adsorptive material 450 present in fin area 410b. At the inlet to fin area 410a, the hot and humid air exiting fin area 410b is mixed with cooler air being supplied by fan 460b. The mixing causes a mist area 800 to be produced at the inlet to fin area 410a by the formation of water droplets suspended in the air. The water droplets can be adsorbed by the adsorptive material 450 present in fin area 410a, thus regenerating the adsorptive material 450. The air-flow is discharged from fin area 410a through exhaust port 475a.

Experimental Results

To quantify the desorption role on the enhancement of heat removal capability of the thermal management system, the following channel filling configurations are examined:

case 1: void or empty channels 430;

case 2: water droplets deposited inside the channels 430 (initial water volume of 10 cm$^3$);

case 3: channels 430 half filled with activated carbon adsorbent (CS400 granular, 1-2 mm diameter); and case 4: channels 430 half filled with silica gel adsorbent (grade 03 granular, 1-2 mm diameter).

For each configuration, the temperature profiles can be measured with a heat load applied to fin areas 410a and/or 410b of the thermal management device 400 using heaters 590a and/or 590b, respectively. Application of the heat load was stopped when a heat dissipater interface temperature of 75° C. was reached. The ambient air temperature at the start of each test varied in the range of about 21 to 26° C. Variation in the ambient air temperature and humidity during testing was nominal.

Figure 9:
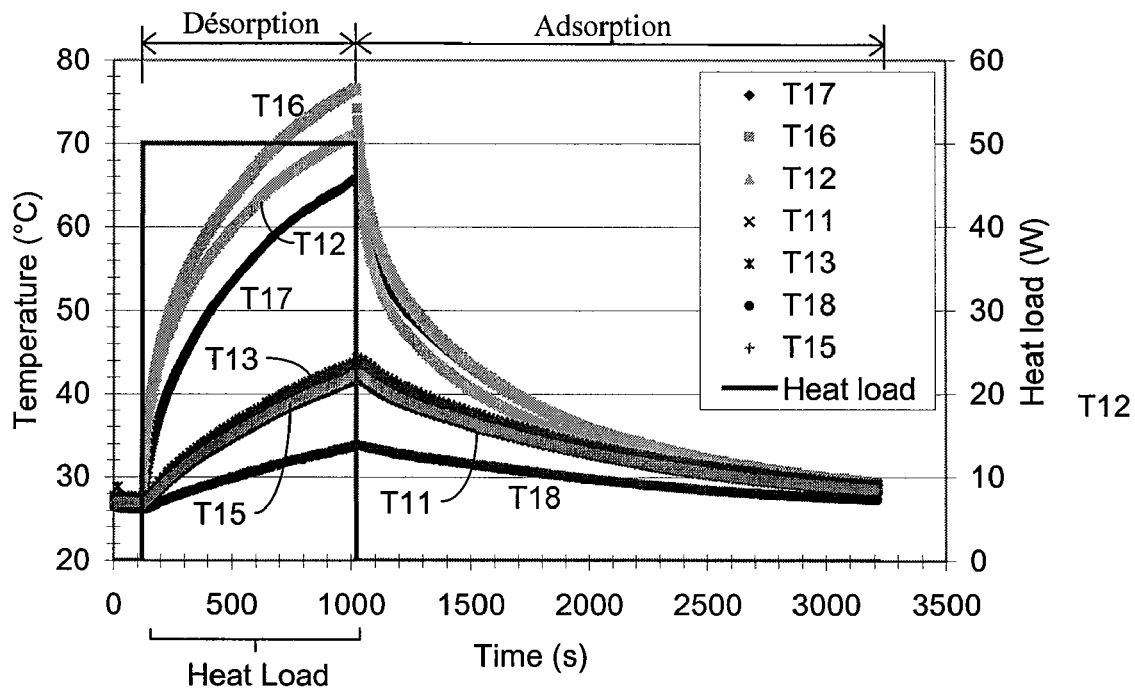
FIG. 9 is a plot that illustrates temperature profiles of the thermal management device 400 of FIG. 5 when a heat load is applied to the first fin area.

FIG. 9 is a plot that illustrates temperature profiles of the thermal management device 400 of FIG. 5 when a heat load is applied to the first fin area 410a. The temperature profiles were measured when a 50 Watt heat load is applied using the heater 590a. Temperature measurements are taken using the thermocouples 611, 612, 613, 615, 616, 617, and 618 indicated in FIG. 6. The corresponding temperature plots are labelled as T11, T12, T13, T15, T16, T17, and T18, respectively.

Thermocouples 612 and 616 (see FIG. 6) are disposed between the heater 590a and the aluminium plate to measure the heat dissipater interface temperature of the thermal management device 400. The temperature measured at thermocouple 616, indicated as T16 on the plot of FIG. 9, reaches 75° C. after 800 s (approximately 13 minutes). At that time, the heat load is turned off and the system temperature decreases to 30° C. after an additional 30 minutes. The temperatures for thermocouples 618 and 617 are the air inlet and outlet temperatures of the heated fin area 410a, respectively. These temperatures are indicated as T18 and T17, respectively, in FIG. 9. The outlet air temperature T17 increases by more than 30° C. as the air-flows through the fin area 410a, reaching a peak of 65° C. at a time of 800 s. At the exhaust port 475b, the air temperature T15 reaches a maximum value of 42° C.

Figure 10:
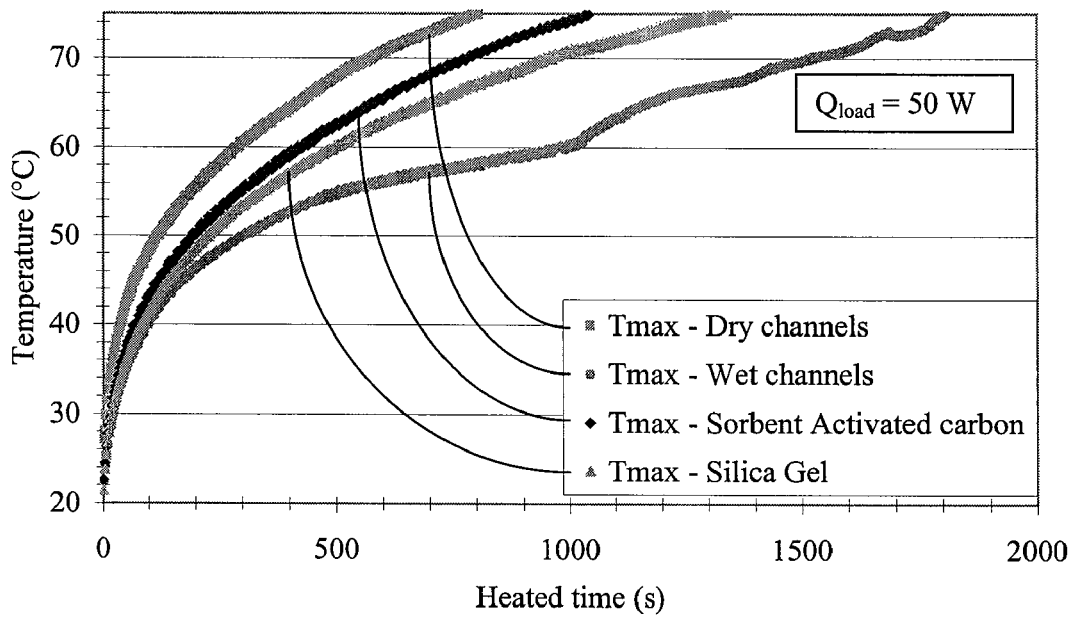
FIGS. 10 through 12 are plots that illustrate heat dissipater interface temperature profiles for different channel filling configurations of the thermal management device of FIG. 5 under different heat loads.
Figure 11:
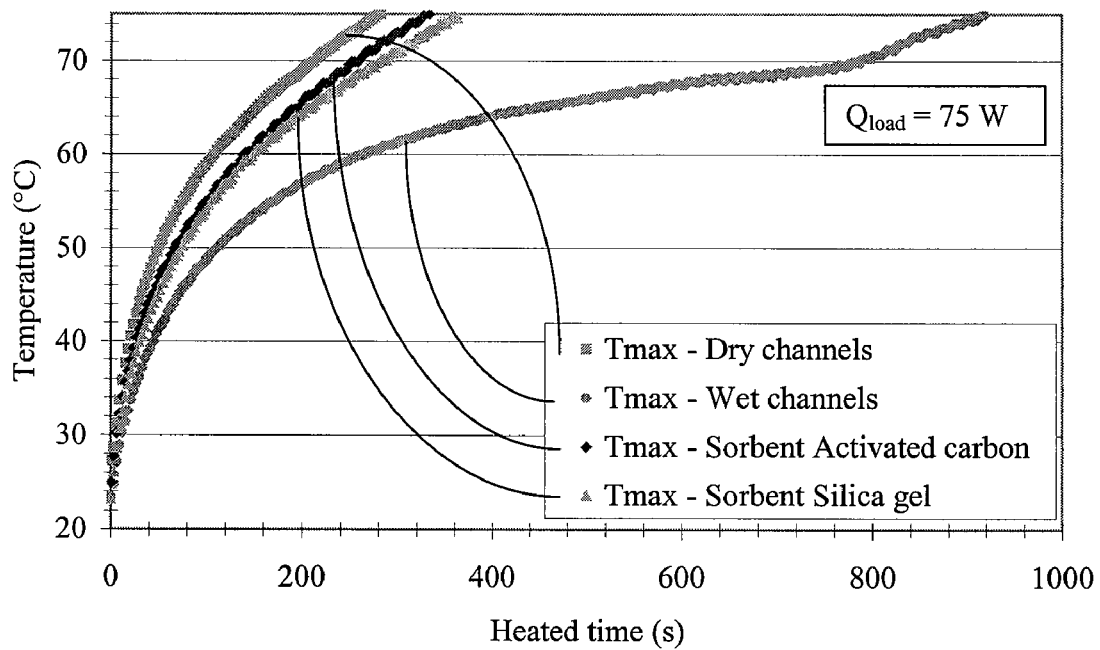
Figure 12:
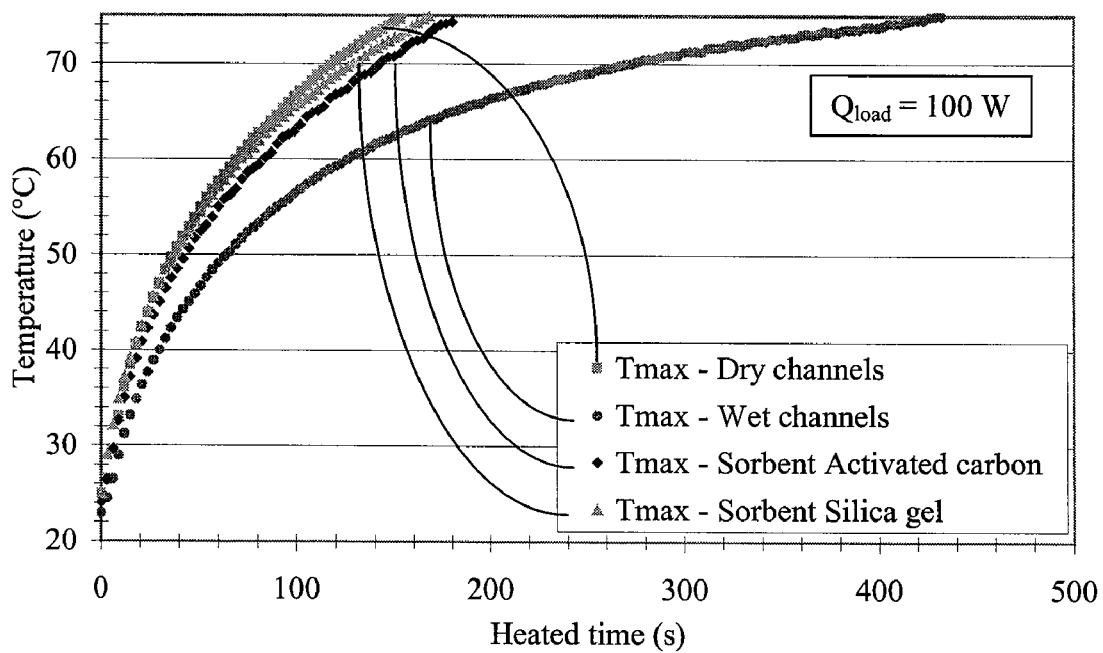

FIGS. 10 through 12 are plots that illustrate heat dissipater interface temperature profiles for different channel filling configurations of the thermal management device 400 of FIG. 5 under different heat loads. Temperature plots of thermocouple 616 for each channel filling configuration are presented. The heat transfer efficiency is characterised by the time to reach 75° C. after the heat load is turned on. The longer is the heating time to reach the target temperature, the better is the heat dissipation performance. FIGS. 10, 11, and 12 illustrate the temperature plots for a 50 Watt, 75 Watt, and 100 Watt heat load, respectively. The heating times are approximately 13 minutes for the void channels 430, 17 minutes for channels 430 half filled with activated carbon granules, 22 minutes for channels 430 half filled with the silica gel granules, and 30 minutes water droplets deposited in channels 430. As illustrated in FIG. 10, there is an improvement of the heat transfer when desorption or evaporation phenomena appear. The best performance is obtained with water droplets deposited in channels 430.

Two reasons help to explain these results. First, the water vapor quantity adsorbed in the porous material is lower than the 10 $cm^3$ of water droplets deposited in the channels 430. Second, the low thermal conductivity of the adsorbent materials (e.g. granular activated carbon and silica gel) and the limited thermal contact between the aluminium plate and the granules deposited in the channels 430 affect the heating of the air and tend to reduce the desorption kinetics of the materials. The thermal contact problem explains why the heat transfer was also reduced for the adsorptive materials compared to water droplet configuration at higher heat flux levels as illustrated in FIGS. 11 and 12.

Figure 13:
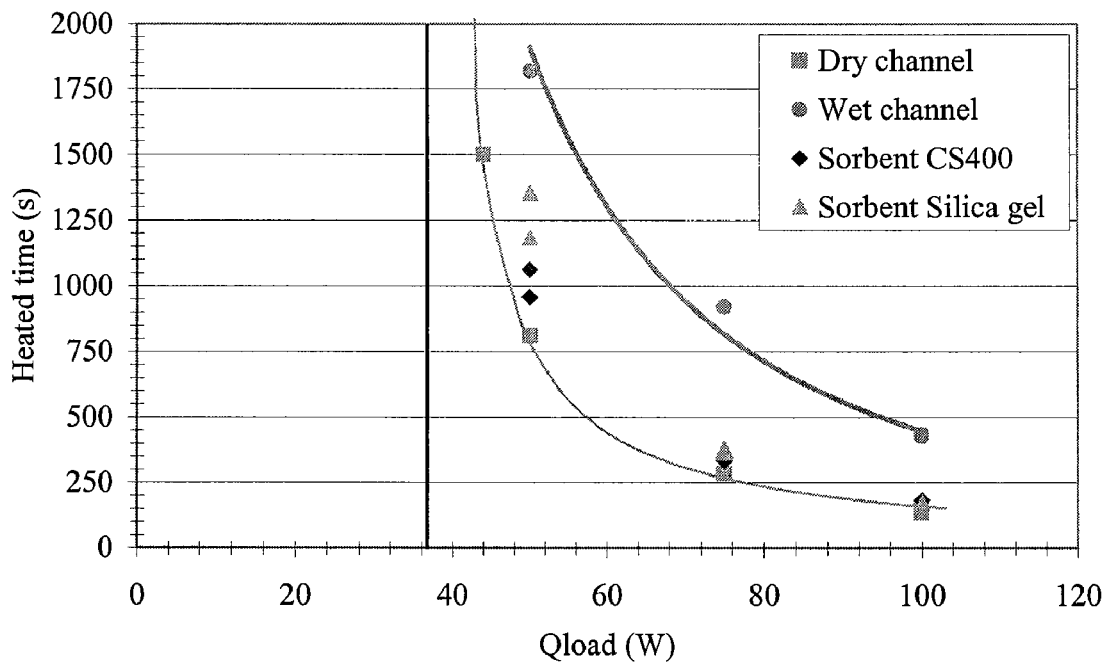
FIG. 13 is a plot that illustrates the heated time as a function of the heat load of the thermal management device of FIG. 5 for different channel fill configurations.

FIG. 13 is a plot that illustrates the heating time as a function of the heat load of the thermal management device 400 of FIG. 5 for different channel fill configurations. It was noted that, at the end of the heating time, the porous material was partially desorbed. When using heater 590a, the heat load for which the thermal management device 400 heat dissipater interface temperature stabilises at 75° C. is equal to 38 Watts. This heat load increases to 50 Watts when heater 590b is used. This result indicates that the air-flow is not symmetric. Nevertheless, these dissipated heats are higher than that dissipated by a conventional laptop thermal management system employing air cooling alone.

For a 100 Watt heat load, the heat dissipater interface temperature is maintained lower than 75° C. for at least 3 minutes. This time is significantly longer than the average time required for power-intensive chip operations such as file recording. This time was extended to more than 8 minutes when the 100 Watt heat load was alternately applied from heaters 590a and 590b as described above for FIGS. 7 and 8.

Figure 14:
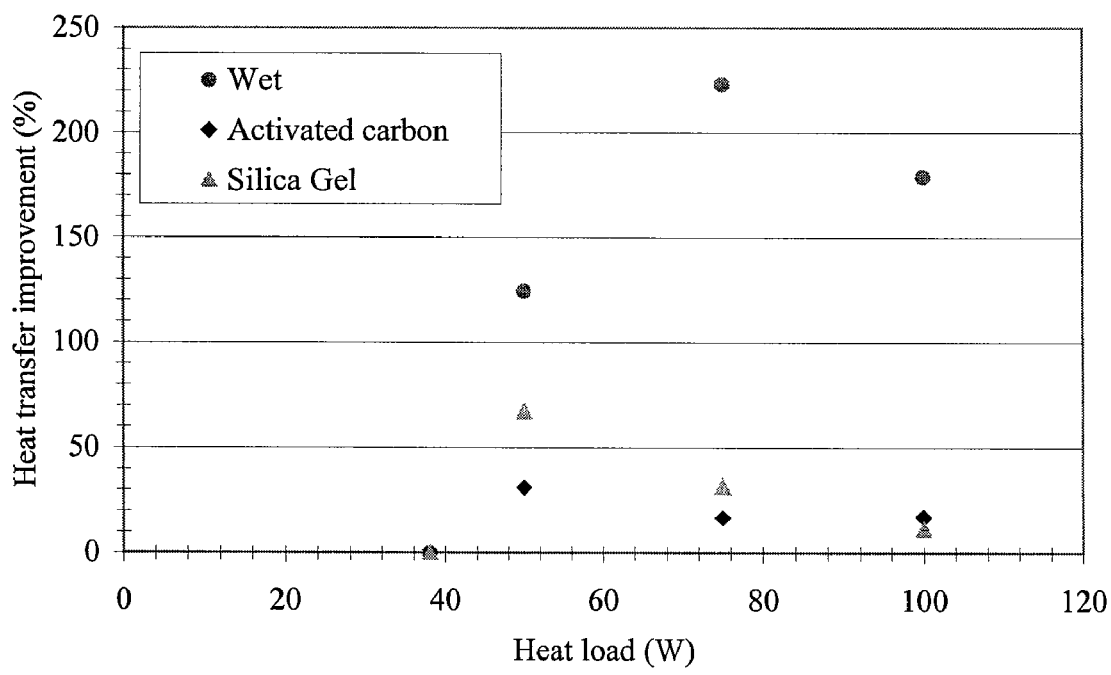
FIG. 14 is a plot that compares the heat transfer capabilities for the different channel filling configurations of the thermal management device of FIG. 5 under different heat loads.

FIG. 14 is a plot that compares the heat transfer capabilities for the different channel filling configurations of the thermal management device 400 of FIG. 5 under different heat loads. A heat transfer improvement of 60% between the silica gel and the void channel configurations was observed when a 50 Watt heat load was applied. This improvement was reduced to 10% when a 100 Watt heat load was applied. Better thermal contact between the fins 420 and the adsorptive materials (e.g. granular activated carbon and silica gel) can increase this improvement and approach those achieved with the water droplet configuration.

Conclusion

In these examples embodiments of thermal management devices and systems for combining air convection and water vapor desorption for heat dissipation enhancement have been presented. These devices are particularly adapted to systems which are limited in volume and whose performance, during a short time, is limited by the heat dissipation. Laptop computer microchip cooling is a typical application.

To test the feasibility of heat dissipation by the thermal management device for a hybrid convection/desorption cooling system, experiments have been performed. The test set up was designed for laptop cooling, which is suitable for integration into a computing system.

Results obtained from the experimental set up show the efficacy of the disclosed hybrid cooling system. The observed heat dissipation performance was higher than those of conventional laptop cooling systems. For a 100 Watt heat load, the heat dissipater interface temperature was maintained lower than 75° C. during a period of at least 8 minutes, when the heat load was alternately applied from heaters 590a and 590b.

Results obtained for silica gel adsorbent material when a 50 Watt heat load was applied show a heat transfer improvement of more than 60% when desorption is combined with convection heat transfer. This improvement was approximately 10% when a 100 Watt heat load was applied. This reduction in improvement is mainly due to the poor thermal contact between the aluminium fins and the granular adsorbent material. This effect induces a reduction of the air heating, thus reducing the desorption kinetics relative to the air relative humidity. Better thermal contact can induce an improvement of the heat transfer approaching the results obtained with the water droplet evaporation in the channels.

Another parameter that can limit the system performance is the air-flow rate. The air-flow rate decreases as back pressure, caused by air-flow cross-section reduction due to the addition of adsorbent material in the channels, increases. Use of a thin adsorbent material layer instead of adsorbent granular would help to reduce this restriction. This would induce an improvement of the convection heat transfer as well as an increase of the air-flow rate for a given supply pressure level.

Another application that could incorporate a thermal management device is photovoltaic panel cooling. Maintaining a lower panel temperature can allow for increased efficiency of solar energy conversion. Desorption phenomena could limit the photovoltaic panel temperature increases during the sunny hours of the day. Water adsorption in the porous adsorbent material (i.e., regeneration of the cooling system) can take place during the night. This would allow for a passive cooling system.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±10%, or more of the numerical value(s) being modified. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

Therefore, the following is claimed:

1. A device, comprising:
   a heat dissipater including a first area and a second area, wherein at least one of the first area and the second area of the heat dissipater is in fluidic communication with a heat source;

a first air-flow directed to circulate across the first area of the heat dissipater; and a second air-flow directed to mix with the first air-flow to form a mixed first and second air-flow, wherein the mixed first and second air-flow is further directed to circulate across the second area of the heat dissipater.

2. The device of claim 1, wherein the heat dissipater further includes adsorptive material disposed in the first area.

3. The device of claim 2, wherein the adsorptive material is selected from at least one of the following: activated carbon, silica gel, porous alumina, calcium chloride, zeolite, or combinations thereof.

4. The device of claim 2, wherein the heat dissipater further includes adsorptive material disposed in the second area.

5. The device in claim 4, wherein the adsorptive material is disposed in the second area is the same adsorptive material disposed in the first area.

6. The device of claim 1, wherein the heat dissipater further includes a radiator in the first area.

7. The device in claim 1, wherein the first air-flow is supplied by a first fan.

8. The device in claim 7, wherein the second air-flow is supplied by a second fan.

9. The device in claim 1, wherein the first air-flow is redirected to circulate across the second area of the heat dissipater and the mixed first and second air-flows is redirected to circulate across the first area of the heat dissipater.

10. The device in claim 1, further comprising a first valve and a second valve for controlling the circulation of the first air-flow.

11. The device in claim 1, further comprising a valve for controlling the mixing of the first air-flow and the second air-flow.

12. The device in claim 1, wherein the heat source is an evaporator that is adjacent a computer chip, wherein the evaporator is in fluidic communication with at least one of the first area and the second area of the heat dissipater.

13. A system, comprising:

an evaporator for removing heat from a heat source;

a heat dissipater including a first area and a second area;

a cooling loop for transferring heat from the evaporator to at least one of the first area and the second area of the heat dissipater;

a first air-flow directed to circulate across the first area of the heat dissipater; and a second air-flow directed to mix with the first air-flow to form the mixed first and second air flow, wherein the mixed first and second air flow is further directed to circulate across the second area of the heat dissipater.

14. The system in claim 13, wherein the heat source is a computer chip.

15. The system in claim 13, wherein the heat dissipater includes a radiator in the first area.

16. The system in claim 15, wherein the radiator includes condenser pipes connected to the cooling loop.

17. The system in claim 13, wherein the cooling loop is a two-phase closed loop.

18. The system in claim 17, wherein the two-phase closed loop is a capillary pump cooling system.

19. The system in claim 17, wherein the two-phase closed loop is a thermosyphon cooling system.

20. The system in claim 17, wherein the two-phase closed loop is a heat pipe cooling system.

21. The system in claim 13, wherein the first air-flow is redirected to circulate across the second area of the heat dissipater and the mixed first and second air-flow is redirected to circulate across the first area of the heat dissipater.

22. A device, comprising:

means for heat dissipation that includes a first area and a second area, wherein at least one of the first area and the second area is in fluidic communication with a heat source;

means for providing a first air-flow for circulation over the means for heat dissipation;

means for providing a second air-flow for mixing with the first air flow and circulation over the means for heat dissipation;

means for directing the first and second air-flow, wherein either the first air-flow is directed over the first area of the means for heat dissipation and the mixed first and second air-flow is directed over the second area of the means for heat dissipation or the first air-flow is directed to the second area of the means for heat dissipation and the mixed first and second air-flow is directed to the first area of the means for heat dissipation.

23. A method of transferring heat, comprising:

providing a heat dissipater including a first area and a second area, wherein at least one of the first area and the second area of the heat dissipater is in fluidic communication with a heat source;

circulating a first air-flow across the first area of the heat dissipater;

circulating a second air-flow to mix with the first air-flow to form a mixed first and second air-flow; and circulating the mixed first and second air-flow across the second area of the heat dissipater.

24. The method in claim 23, further comprising redirecting the first air-flow to circulate across the second area of the heat dissipater and redirecting the mixed first and second air-flow to circulate across the first area of the heat dissipater.

* * * * *

UNITED STATES PATENT AND TRADEMARK OFFICE
CERTIFICATE OF CORRECTION

PATENT NO.       : 7,532,467 B2
APPLICATION NO.  : 11/867070
DATED            : May 12, 2009
INVENTOR(S)      : Launay et al.

It is certified that error appears in the above-identified patent and that said Letters Patent is hereby corrected as shown below:

On the title page, item [75] should read:

--(75) Inventors: Stephane Launay, Nantes (FR); Andrei G. [Federov] --Fedorov--, Atlanta, GA (US) Yogendra Joshi, Decatur, GA (US)--.

Signed and Sealed this

Twenty-fifth Day of August, 2009

David J. Kappos
*Director of the United States Patent and Trademark Office*